(12) United States Patent
Tanaka et al.

(10) Patent No.: US 10,830,950 B2
(45) Date of Patent: Nov. 10, 2020

(54) OPTICAL TRANSMITTER-RECEIVER

(71) Applicants: FUJITSU LIMITED, Kawasaki-shi, Kanagawa (JP); Photonics Electronics Technology Research Association, Bunkyo-ku, Tokyo (JP)

(72) Inventors: Shinsuke Tanaka, Hiratsuka (JP); Tatsuya Usuki, Tsukuba (JP)

(73) Assignees: FUJITSU LIMITED, Kawasaki (JP); PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days.

(21) Appl. No.: 16/669,845

(22) Filed: Oct. 31, 2019

(65) Prior Publication Data

US 2020/0150340 A1   May 14, 2020

(30) Foreign Application Priority Data

Nov. 13, 2018   (JP) .................................. 2018-212647

(51) Int. Cl.
| | |
|---|---|
| *G02B 6/12* | (2006.01) |
| *H01L 31/0232* | (2014.01) |
| *H04B 10/40* | (2013.01) |

(52) U.S. Cl.
CPC .... *G02B 6/12004* (2013.01); *H01L 31/02325* (2013.01); *H04B 10/40* (2013.01);
(Continued)

(58) Field of Classification Search
CPC ...... G02B 6/12004; G02B 2006/12097; G02B 2006/12142; H01L 31/02325; H04B 10/40

See application file for complete search history.

(56) References Cited

U.S. PATENT DOCUMENTS

| | | | |
|---|---|---|---|
| 6,600,178 B1 * | 7/2003 | Washio | ............. H01L 29/66242 |
| | | | 257/191 |
| 2015/0270814 A1 | 9/2015 | Ban et al. | |

(Continued)

FOREIGN PATENT DOCUMENTS

| | | |
|---|---|---|
| JP | 2011-232567 | 11/2011 |
| JP | 2012-249051 | 12/2012 |

(Continued)

*Primary Examiner* — Ellen E Kim
(74) *Attorney, Agent, or Firm* — Staas & Halsey LLP

(57) ABSTRACT

An optical transmitter-receiver includes an optical integrated device in which at least an optical modulator and an optical detector are integrated as optical devices over the same substrate and an insulating layer is provided between the optical modulator and the substrate and between the optical detector and the substrate, and an electronic circuit chip that is connected to the optical integrated device and includes an electronic circuit including a ground wiring line. The optical integrated device includes a shield electrode between the optical modulator and the optical detector, and the shield electrode is provided sandwiching the insulating layer with the substrate to configure a capacitance and is connected to the ground wiring line of the electronic circuit chip. By the optical transmitter-receiver, crosstalk through the capacitance between the optical modulator and the substrate, the substrate, and the capacitance between the optical detector and the substrate can be suppressed to suppress deterioration of the reception characteristic.

12 Claims, 12 Drawing Sheets

(52) U.S. Cl.
CPC .............. *G02B 2006/12097* (2013.01); *G02B 2006/12142* (2013.01)

(56) References Cited

U.S. PATENT DOCUMENTS

2016/0064291 A1* 3/2016 Ishii ........................ H01L 24/97
                                                                    438/15
2017/0285372 A1* 10/2017 Baba ..................... G02F 1/2257

FOREIGN PATENT DOCUMENTS

| JP | 2013-207231 | 10/2013 |
| JP | 2014-192510 | 10/2014 |
| WO | 2010/004850 | 1/2010 |

* cited by examiner

OPTICAL TRANSMITTER-RECEIVER

CROSS-REFERENCE TO RELATED APPLICATION

This application is based upon and claims the benefit of priority of the prior Japanese Patent Application No. 2018-212647, filed on Nov. 13, 2018, the entire contents of which are incorporated herein by reference.

FIELD

The embodiment discussed herein is directed to an optical transmitter-receiver.

BACKGROUND

An optical integrated device provided in an optical transmitter-receiver has a plurality of optical devices such as, for example, an optical modulator and an optical detector integrated therein.

In order to drive an optical modulator or an optical detector provided in such an optical integrated device as just described, an electronic circuit such as, for example, a driver circuit or an amplification circuit is demanded.

Therefore, the optical transmitter-receiver is implemented by flip chip mounting an electronic circuit chip including such an electronic circuit as just described onto an optical integrated device.

[Patent Document 1] Japanese Laid-Open Patent Application No. 2013-207231

[Patent Document 2] Japanese Laid-Open Patent Application No. 2011-232567

[Patent Document 3] International Publication No. 2010/004850

[Patent Document 4] Japanese Laid-Open Patent Application No. 2012-249051

[Patent Document 5] Japanese Laid-Open Patent Application No. 2014-192510

However, in an optical integrated device (optical integration circuit device, element) that configures an optical transmitter-receiver, an optical modulator and an optical detector are integrated over a same substrate and an insulating layer (for example, an $SiO_2$ layer) is provided between the optical modulator and the substrate and between the optical detector and the substrate (for example, refer to FIG. 12).

Therefore, it has been found that a capacitance appears between the optical modulator and the substrate and between the optical detector and the substrate and crosstalk occurs through the capacitance between the optical modulator and the substrate, the substrate, and the capacitance between the optical detector and the substrate deteriorates the reception characteristic (for example, refer to FIG. 12).

SUMMARY

According to an aspect of the embodiments, an optical transmitter-receiver includes an optical integrated device in which at least an optical modulator and an optical detector are integrated as optical devices over the same substrate and an insulating layer is provided between the optical modulator and the substrate and between the optical detector and the substrate, and an electronic circuit chip that is connected to the optical integrated device and includes an electronic circuit including a ground wiring line, and wherein the optical integrated device includes a shield electrode between the optical modulator and the optical detector, and the shield electrode is provided sandwiching the insulating layer with the substrate to configure a capacitance and is connected to the ground wiring line of the electronic circuit chip.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT(S)

In the following, an optical transmitter-receiver according to an embodiment of the present disclosure is described with reference to FIGS. 1 to 12 of the drawings.

For example, in order to cope with increase of the communication capacity inside and outside of a data center, the optical transmitter-receiver according to the present embodiment implements a high-performance and small-sized optical transmitter-receiver that utilizes an optical integrated device in which an optical modulator and an optical detector are integrated on a single substrate.

Figure 1:
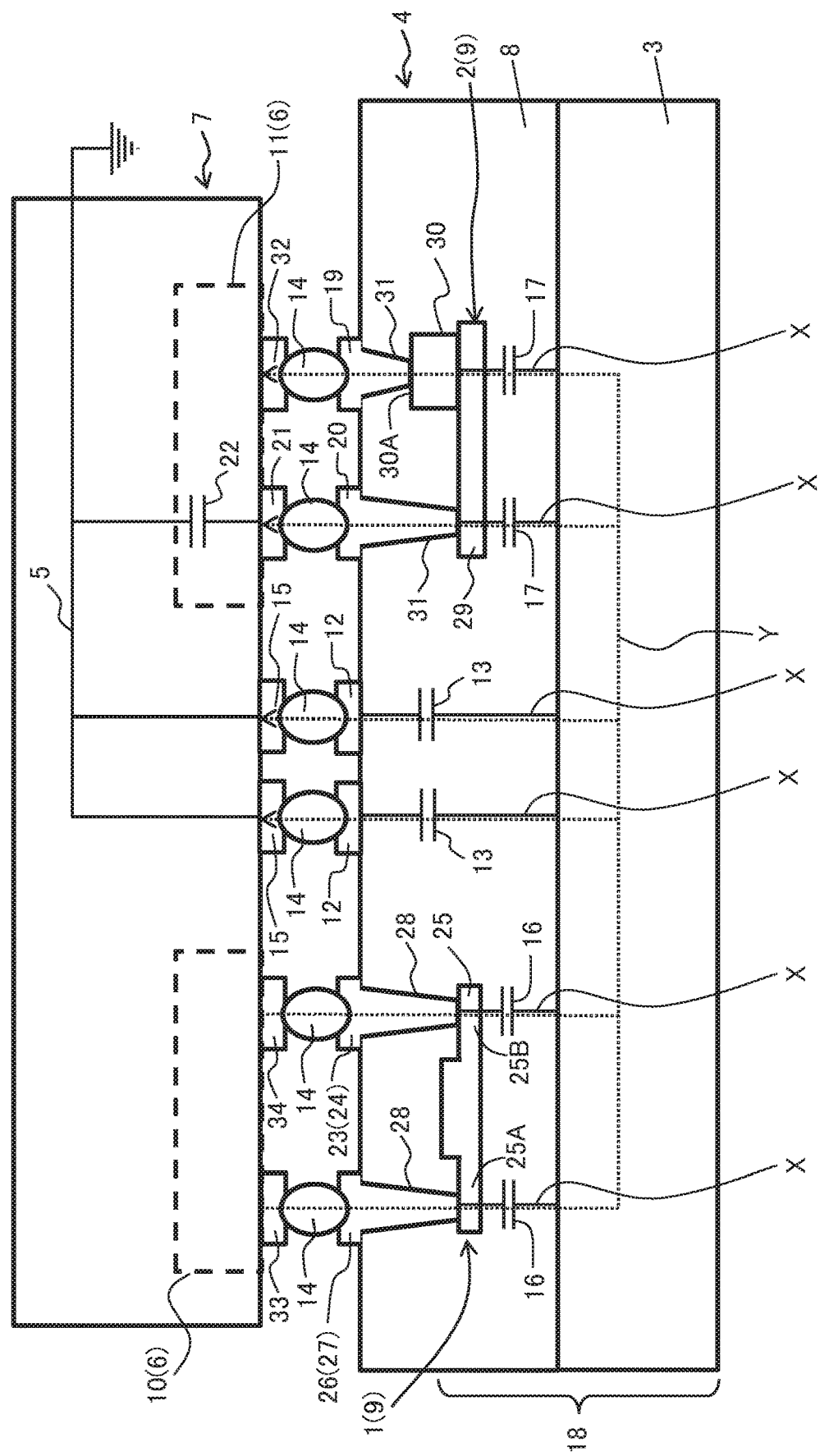
FIG. 1 is a sectional view depicting a configuration of an optical transmitter-receiver according to the present embodiment.

As depicted in FIG. 1, the optical transmitter-receiver of the present embodiment includes an optical integrated device 4 in which at least an optical modulator 1 and an optical detector 2 are integrated as optical devices 9 over a same substrate 3 and an electronic circuit chip 7 connected to the optical integrated device 4 and including an electronic circuit 6 including a ground wiring line 5.

Here, in the optical integrated device 4, an insulating layer 8 is provided between the optical modulator 1 and the substrate 3 and between the optical detector 2 and the substrate 3.

The electronic circuit chip 7 drives the optical devices (integrated optical circuits) 9 provided in the optical integrated device 4. For example, the electronic circuit chip 7 includes a driver circuit 10 for driving the optical modulator 1 and a trans-impedance amplifier (TIA) circuit (amplification circuit; reception circuit) 11 for driving the optical detector 2.

It is to be noted that the optical transmitter-receiver is referred to also as integrated optical transmitter-receiver. Further, the optical integrated device 4 is referred to also as optical integrated circuit device, integrated optical circuit device or optical integrated circuit chip. Further, the electronic circuit chip 7 is referred to also as electronic circuit element.

Especially, in the present embodiment, the optical integrated device 4 includes shield electrodes 12 between the optical modulator 1 and the optical detector 2.

Further, each shield electrode 12 configures a capacitance 13 by being provided so as to cooperate with the substrate 3 to sandwich the insulating layer 8 therebetween and is connected to the ground wiring line 5 of the electronic circuit chip 7.

Figure 2:
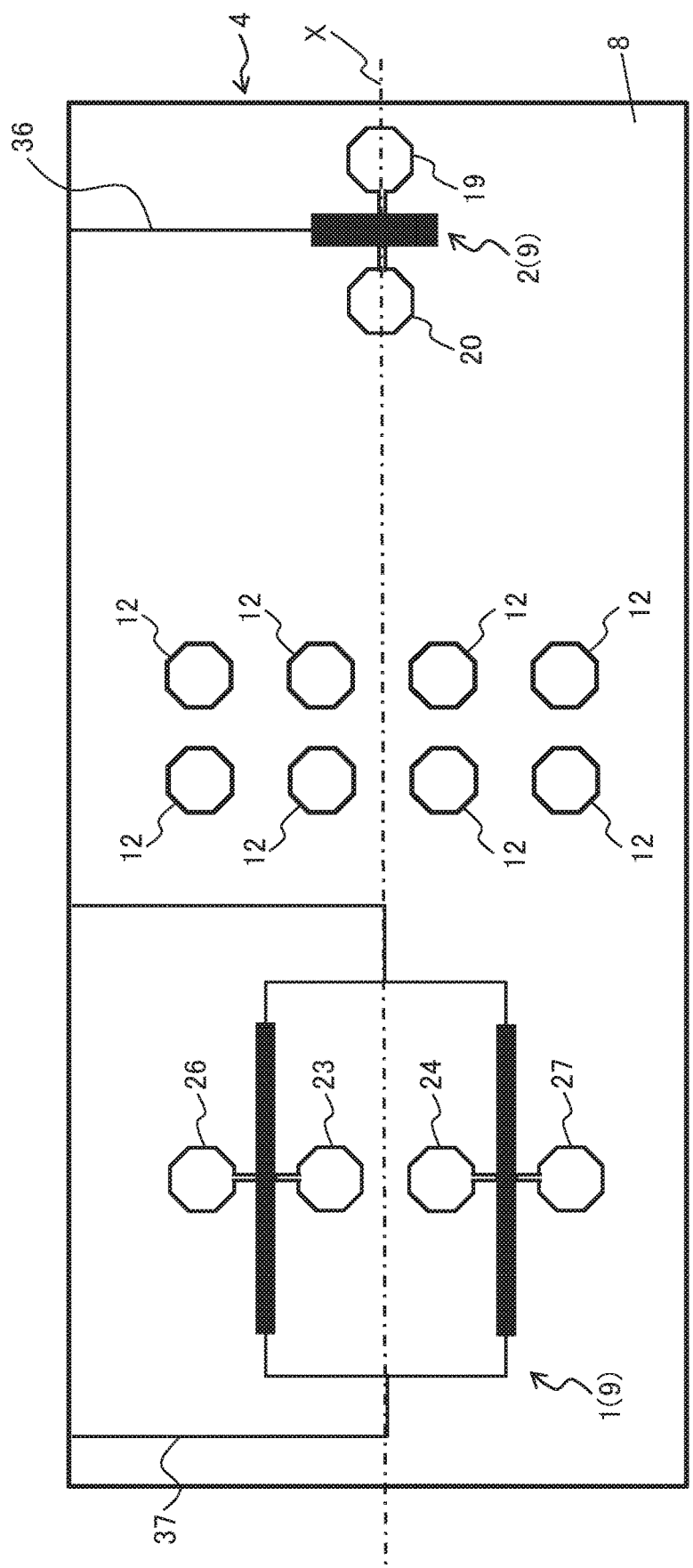
FIG. 2 is a top plan view depicting a configuration of the optical transmitter-receiver according to the present embodiment.

Here, the shield electrodes 12 are provided on the surface of the optical integration device 4 as depicted in FIGS. 1 and 2.

Further, the shield electrodes 12 are provided discretely. In short, the shield electrodes 12 are discrete electrodes.

It is to be noted that the shield electrodes 12 may be provided in a plane. The shield electrodes 12 may have some other shape.

Further, each shield electrode 12 is an electrode that is not connected to the optical device (optical element) 9 provided in the optical integration device 4. For example, each shield electrode 12 is an electrode that is not connected to a wiring line (for example, a ground wiring line) connected to the optical device 9 provided in the optical integration device 4.

Here, the substrate 3 of the optical integration device 4 is a silicon substrate, and the insulating layer 8 is an $SiO_2$ layer. Further, each shield electrode 12 is a metal electrode such as, for example, an Al electrode. It is to be noted that the Al electrode is referred to also as Al pad. Further, the metal electrode is referred to also as metal pad.

In the present embodiment, as depicted in FIG. 1, the electronic circuit chip 7 is flip chip mounted on and joined (bump joined) to the optical integrated device 4 through bumps (metal bumps) 14.

The shield electrodes 12 are connected to the ground wiring line 5 of the electronic circuit chip 7 through the bumps 14. Here, the shield electrodes 12 are connected to ground terminals 15 connected to the ground wiring line 5 in the electronic circuit chip 7 through the bumps 14.

It is to be noted that the ground wiring line 5 in the electronic circuit chip 7 is referred to also as in-chip ground wiring line.

By providing the shield electrodes 12 within a region between the optical modulator 1 and the optical detector 2 so as to cooperate with the substrate 3 to sandwich the insulating layer 8 therebetween as described above, the capacitance 13 is provided intentionally between the optical modulator 1 and the optical detector 2 such that a crosstalk signal that propagates in the substrate 3 is extracted from the substrate 3 before the crosstalk signal reaches the optical detector 2.

In particular, a crosstalk signal inputted to the substrate 3 through a capacitance 16 between the optical modulator 1 and the substrate 3 and propagating in the substrate 3 is extracted from the substrate 3 through the capacitances 13 between the substrate 3 and the shield electrodes 12 thereby to suppress the crosstalk signal propagating on the substrate 3 from reaching the optical detector 2.

It is to be noted that, in FIG. 1, reference character X denotes an equivalent circuit and reference character Y denotes a propagation path of a crosstalk signal.

Further, by coupling the shield electrodes 12 configuring the capacitances 13 to the ground wiring line 5 of the electronic circuit chip 7, a crosstalk signal propagating in the substrate 3 is extracted sufficiently from the substrate 3 through the capacitances 13 between the substrate 3 and the shield electrodes 12.

In short, in the electronic circuit chip 7, the ground wiring line 5 having a great number of wiring layers and low resistance can be formed.

Therefore, by coupling the shield electrodes 12 to such a low-resistance ground wiring line 5 of the electronic circuit chip 7 as described above, the shield electrodes 12 can be set to a ground potential or a potential in the proximity of the ground potential with certainty and a crosstalk signal propagating in the substrate 3 is extracted sufficiently from the substrate 3 through the capacitances 13 between the substrate 3 and the shield electrodes 12.

In this manner, crosstalk through the capacitance 16 between the optical modulator 1 and the substrate 3, the substrate 3, and capacitances 17 between the optical detector 2 and the substrate 3 can be suppressed and deterioration of the reception characteristic can be suppressed.

It is to be noted that also it is conceivable that a ground wiring line is provided on the optical integration device 4 and the shield electrodes 12 are connected to the ground wiring line of the optical integration device 4.

However, it is difficult to forma low-resistance ground wiring line in the optical integration device 4.

Therefore, even if the shield electrodes 12 are connected to the ground wiring line provided in the optical integration device 4, it is difficult to set the shield electrodes 12 to the ground potential or a potential in the proximity of the ground potential.

As a result, a crosstalk signal propagating in the substrate 3 through the capacitances 13 between the substrate 3 and the shield electrodes 12 is not extracted sufficiently from the substrate 3, and it is difficult to sufficiently suppress crosstalk through the capacitances 16 between the optical modulator 1 and the substrate 3, the substrate 3 and the capacitances 17 between the optical detector 2 and the substrate 3.

Further, it is generally difficult in a manufacturing process to forma planar low-resistance ground wiring line between an SOI (Silicon on Insulator) layer (optical waveguide layer) and a supporting substrate in an SOI substrate 18 that is used for an optical integrated device (optical integrated circuit).

Therefore, the low-resistance ground wiring line 5 of the electronic circuit chip 7 is used as described above without using the ground wiring line on the SOI substrate, which is difficult to manufacture.

It is to be noted that, while also it is conceivable to reduce the resistance of the substrate 3 such that the substrate 3 functions as a ground wiring line, since it is difficult for this method to sufficiently reduce the resistance of a path from the substrate 3 to an external ground terminal, it is difficult to suppress crosstalk through the capacitances 16 between the optical modulator 1 and the substrate 3, the substrate 3 and the capacitances 17 between the optical detector 2 and the substrate 3.

Incidentally, in the present embodiment, the substrate (supporting substrate) 3 of the optical integration device 4 is a substrate (high-resistance substrate) having a resistivity of approximately 100 ωcm or more.

In particular, as the supporting substrate 3 of the optical integration device 4, a high-resistance substrate having a high resistivity of approximately 100 ωcm or more (for example, approximately 750 ωcm or the like) is used in place of a generally-used low-resistance substrate having a low resistivity of approximately 10 ωcm.

Here, in order to configure the optical integration device 4 using the SOI substrate 18, a high-resistance Si substrate having a high resistivity of approximately 100 ωcm or more is used as a supporting substrate of the SOI substrate 18.

In this manner, by providing the shield electrode 12 connected to the ground wiring line 5 of the electronic circuit chip 7 described above and configuring the supporting substrate 3 as a high-resistance substrate, namely, by combining the countermeasures just described, an excellent crosstalk suppression effect can be obtained and a good reception characteristic can be implemented.

Further, in the present embodiment, as depicted in FIGS. 1 and 2, the optical detector 2 includes a signal terminal 19 and a bias terminal 20, and the signal terminal 19 is provided so as to be positioned at the remote side from the optical modulator 1.

Meanwhile, the electronic circuit chip 7 includes a chip side bias terminal 21 connected to the bias terminal 20 of the optical detector 2 and a capacitive element (bypass capacitor) 22 provided between the chip side bias terminal 21 and the ground wiring line 5.

In particular, in the electronic circuit chip 7, the chip side bias terminal 22 and the ground wiring line 5 are connected to each other through the capacitance element 22.

It is to be noted that the bias terminal 20 of the optical detector 2 and the chip side bias terminal 21 of the electronic circuit chip 7 are provided for supplying a bias voltage to the optical detector 2.

Here, the bypass capacitor 22 is provided in the proximity of the chip side bias terminal 21 in the electronic circuit chip 7 (here, in the TIA circuit 11).

In particular, the bypass capacitor 22 is integrated just near to the chip side bias terminal 21 in the electronic circuit chip 7 and is connected to the chip side bias terminal 21.

It is to be noted that the bypass capacitor 22 is referred to also as in-chip bypass capacitor or in-chip capacitive element.

Consequently, the influence of a parasitic resistance or an inductance appearing between the chip side bias terminal 21 and the ground wiring line 5 can be removed as much as possible and a higher crosstalk suppression effect can be obtained.

In this manner, the bypass capacitors 22 are integrated devices in the electronic circuit chip 7, and they are different from a bulk capacitor of a separate body connected to the chip side bias terminal 21 through a bonding wire or the like for suppression of the bias voltage noise injected from a bias power supply (not depicted).

Further, in the present embodiment, the optical modulator 1 is an optical modulator driven by differential signals and includes a first signal terminal 23 and a second signal terminal 24 to which the differential signals are inputted as depicted in FIG. 2.

Then, the first signal terminal 23 and the second signal terminal 24 of the optical modulator 1 are provided so as to be symmetric with respect to a line passing the center of the signal terminal 19 and the bias terminal 20 of the optical detector 2 (line indicated by reference character X in FIG. 2).

Further, the shield electrodes 12 are provided so as to be symmetric with respect to the line passing the center of the signal terminal 19 of the optical detector 2 (line indicated by reference character X in FIG. 2).

In particular, in the present embodiment, the first signal terminal 23 and the second signal terminal 24 that function as differential electrodes of the optical modulator 1 driven by differential signals are provided so as to be line symmetric with respect to a line passing the central position of the plurality of shield electrodes 12 provided discretely and the center position of the signal terminal 19 and the bias terminal 20 of the optical modulator 1 (line indicated by reference character X in FIG. 2).

In the following, an example of a particular configuration is described.

In the particular configuration example, as depicted in FIG. 1, the optical integration device 4 in which the optical modulator 1 and optical detector 2 are integrated and the electronic circuit chip 7 in which the driver circuit 10 and the TIA circuit 11 are integrated are flip chip mounted through the bumps 14.

The optical integration device 4 is formed on the SOI substrate 18 for which a high-resistance substrate having a high resistivity of approximately 750 ωcm is used as the supporting substrate 3 and includes the optical modulator 1 and the optical detector 2.

The optical modulator 1 includes a rib optical waveguide 25 formed by processing an Si layer of a thickness of approximately 220 nm, and in the rib optical waveguide 25, a p-Si region 25A and an n-Si region 25B are formed by doping into p-Si and n-Si suitably by an ion injection process. The rib optical waveguide 25 has a function for modulating the phase of an optical signal propagating therein with a transmission electric data signal inputted thereto.

The wiring lines (including pads) are Al wiring lines of one layer (including Al pads), and Al pads 23, 24 and 26, 27 included in the Al wiring lines (Al wiring line layer) are connected to the p-Si/n-Si regions 25A and 25B by W plugs 28.

It is to be noted that an Al wiring line is referred to also as metal wiring line. Further, an Al pad is referred to also as metal pad. Further, a W plug is referred to also as metal plug.

The optical detector 2 is structured such that a Ge light absorption layer 30 is stacked on the p-Si layer 29 having a thickness of approximately 220 nm, and an n-Ge region 30A is formed at least at an upper portion of the Ge light absorption layer 30 by being doped with n-Ge to form a PIN structure.

The Al pads 19 and 20 included in the Al wiring lines are connected to the p-Si layer 29 and the n-Ge region 30A by the W plugs 31 (terminals; metal terminals), respectively.

The Al pad 20 connected to the p-Si layer 29 is a bias terminal for applying a bias voltage required for high-speed operation of the optical detector 2, and the Al pad 19 connected to the n-Ge region 30A is a signal terminal.

In the region between the optical modulator 1 and the optical detector 2, the shield electrodes 12 that are configured from the Al pads and are not connected to the Al wiring lines are formed discretely.

The electronic circuit chip 7 is a CMOS circuit formed on the Si substrate and includes the driver circuit 10 and the TIA circuit 11.

Inputting and outputting of signals, power supply and ground to and from the circuits 10 and 11 are performed through the Al pads 21, 32, 33 and 34 provided on the surface of the electronic circuit chip 7.

It is to be noted that one of the Al pads of the TIA circuit 11 is the chip side bias terminal 21 and the other one of the Al pads is the chip side signal terminal (TIA input terminal) 32.

In the optical integration device 4 and the electronic circuit chip 7, the corresponding Al pads are connected to each other by the SnAg bumps 14.

Then, the shield electrodes 12 are connected to the ground wiring line 5 provided in the inside of the electronic circuit chip 7 and shared by the circuits through the SnAg bumps 14 and the Al pads (ground terminals) 15.

Here, FIG. 2 is a view of the optical integration device 4 according to the present embodiment as viewed from above and depicts a layout of the optical modulator 1, shield electrodes 12 and optical detector 2.

As depicted in FIG. 2, the optical modulator 1 is a Mach-Zehnder optical modulator for which a pair of rib optical waveguide structures described above are used, and differential electric signals generated by the driver circuit 10 are inputted through four Al pads that function as the ground terminal 26, signal (P) terminal (first signal terminal) 23, signal (N) terminal (second signal terminal) 24 and ground terminal 27.

It is to be noted that, in FIG. 2, reference numerals 36 and 37 indicate each an optical waveguide.

The shield electrodes 12 are provided discretely between the optical modulator 1 and the optical detector 2 and are a plurality of Al pads that are not connected to any optical element 9.

The optical detector 2 is connected to two Al pads that function as the bias terminal 20 and the signal terminal 19.

Further, the signal terminal 19 of the optical detector 2, namely, the signal terminal 19 connected to the input terminal (TIA input; chip side signal terminal) of the TIA circuit 11 provided in the electronic circuit chip 7 (here, the signal terminal 19 is an Al pad that is a terminal connected to the n-Ge region 30A), is located remotely from the optical modulator 1.

Further, the signal (P) terminal 23 and the signal (N) terminal 24 that function as differential electrodes of the optical modulator 1 are disposed in a line symmetrical relationship with respect to the line (line indicated by reference character X in FIG. 2) that pass the center position of the plurality of shield electrodes 12 provided discretely and the center position of the terminals of the optical modulator 1.

By adopting such a layout as just described, since differential crosstalk signals generated in the optical modulator 1 receive same amount of attenuation and phase rotation between the differential pair before the differential crosstalk signals reach the signal terminal 19 of the optical detector 2, an effect that the differential crosstalk signals are cancelled in the signal terminal 19 of the optical detector 2 can be obtained.

In the optical transmitter-receiver configured in such a manner as described above, the crosstalk path between the optical transmitter-receivers is a path indicated by reference character Y in FIG. 1.

In FIG. 1, as indicated by reference character Y, a transmission signal generated by the driver circuit 10 of the electronic circuit chip 7 and inputted to the optical modulator 1 of the optical integration device 4 is inputted to the high-resistance Si substrate 3 by capacitive coupling, and the inputted crosstalk signal propagates in a direction toward the optical detector 2 in the high-resistance Si substrate 3.

Since, upon propagation in the high-resistance Si substrate 3, the crosstalk signal flows into the ground wiring line (in-chip GND) 5 of the electronic circuit chip 7 through the shield electrodes 12 in the capacitive coupling, the intensity is attenuated significantly.

The crosstalk signal arriving at the optical detector 2 of the optical integration device 4 flows into the bias terminal 20 and the signal terminal 19 by the capacitive coupling.

Then, the bias terminal 20 of the optical detector 2 is connected and grounded to the in-chip GND 5 through the bump 14, the chip side bias terminal 21 of the electronic circuit chip 7 and the bypass capacitor (capacitive element) 22 provided in the electronic circuit chip 7, and the crosstalk signal is further attenuated through the path.

In this manner, crosstalk through the capacitance 16 between the optical modulator 1 and the substrate 3, the substrate 3 and the capacitance 17 between the optical detector 2 and the substrate 3 can be suppressed and a good reception characteristic can be implemented.

Figure 3:
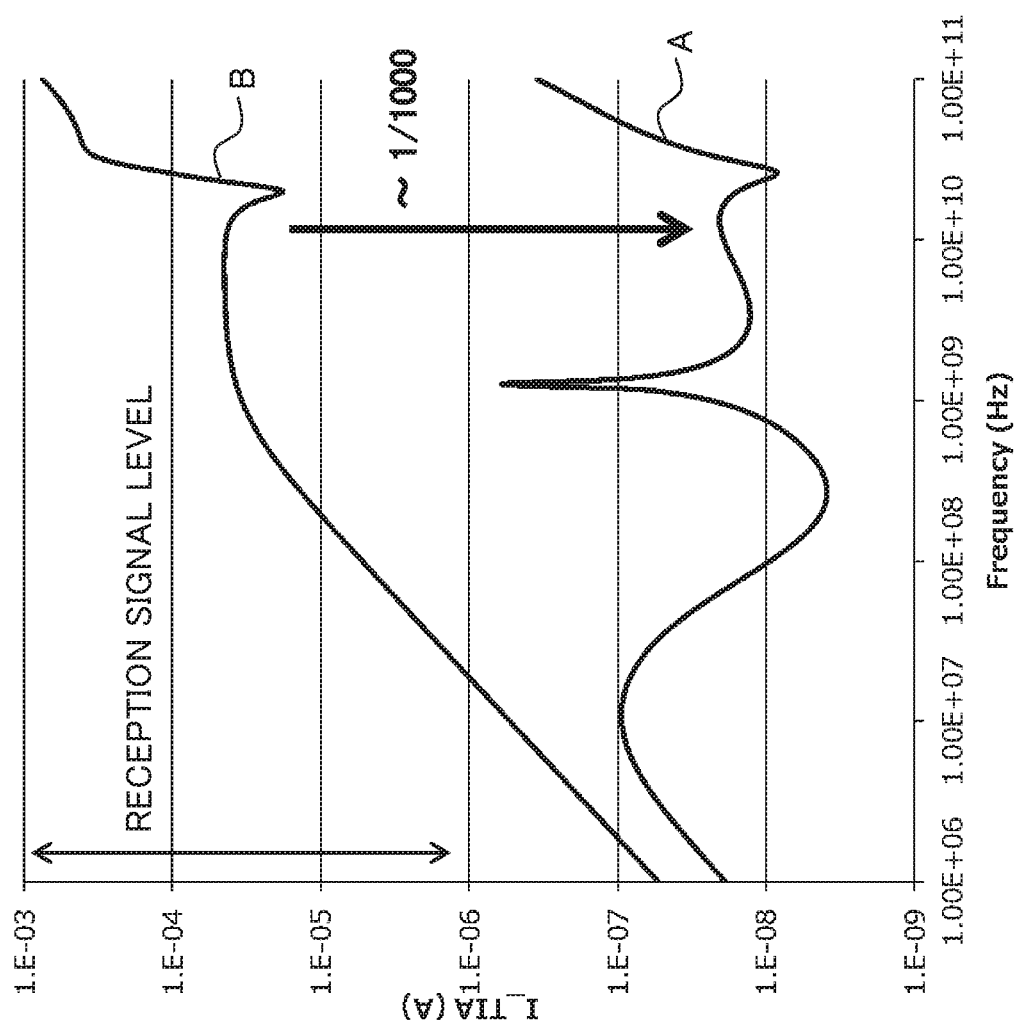
FIG. 3 is a view depicting a result of calculation by a simulation of a crosstalk signal at a TIA input terminal of the optical transmitter-receiver in a particular example of a configuration of the present embodiment.

Here, FIG. 3 depicts a result of calculation of a crosstalk signal at the TIA input terminal (signal terminal) when the optical transmitter-receiver in the particular configuration example of the present embodiment is simulated.

It is to be noted that, in FIG. 3, a solid line A indicates a result of calculation of the crosstalk signal in the optical transmitter-receiver of the particular configuration example of the present embodiment and a solid line B indicates a result of calculation of the crosstalk signal in the case where a low-resistance Si substrate (resistivity of approximately 10 ωcm) is used as a supporting substrate without providing the shield electrode and bypass capacitor in a same layout.

As depicted in FIG. 3, by adopting the configuration of the particular configuration example of the present embodiment, the crosstalk signal (crosstalk current amount) is suppressed to 1/1000 in the maximum over a very wide frequency region from 1 MHz to 100 GHz in comparison with the conventional structure.

Then, by applying the configuration of the particular configuration example of the present embodiment, the crosstalk signal can be sufficiently suppressed lower than a reception signal level (1 µA to 1 mA) assumed in the optical transmitter-receiver. Consequently, crosstalk between the transmitter and the receiver of the optical transmitter-receiver can be cancelled and a good reception characteristic can be implemented.

In the following, details of the effect are described with reference to FIGS. 4 to 8.

Figure 4:
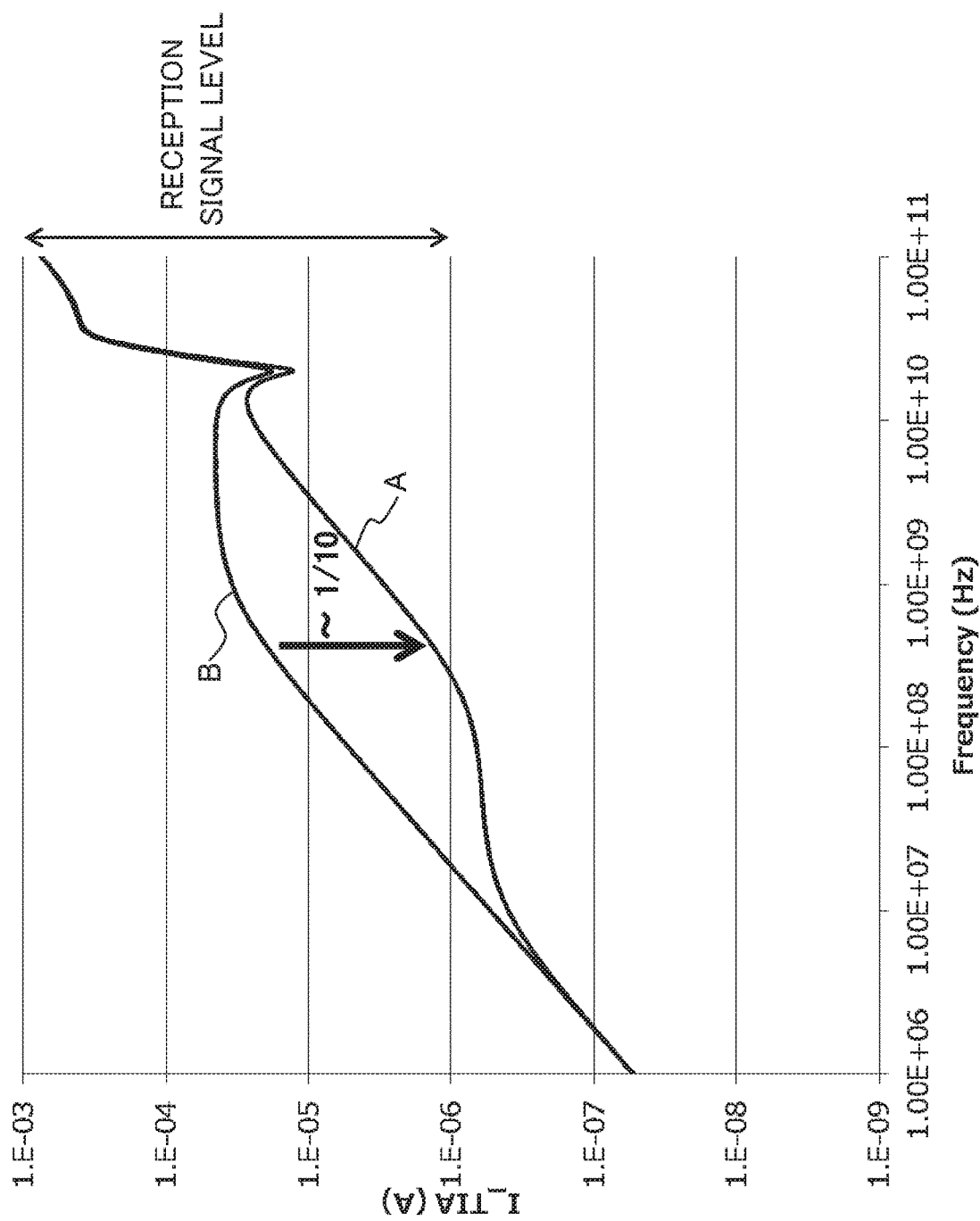
FIG. 4 is a view depicting a result of calculation by a simulation of the crosstalk signal at the TIA input terminal of the optical transmitter-receiver in a case in which a low-resistance Si substrate (resistivity of approximately 10 $\omega$cm) is used and in another case in which a high-resistance Si substrate (resistivity of approximately 750 $\omega$cm) is used under the condition that a shield electrode and a bypass capacitor are not provided.

First, FIG. 4 depicts a result when crosstalk signals (crosstalk current amounts) in a case in which a low-resistance Si substrate (resistivity of approximately 10 $\omega$cm) is used as the substrate 3 (conventional structure) and in another case in which a high-resistance Si substrate (resistivity of approximately 750 $\omega$cm) is used under the condition that the shield electrode 12 and the bypass capacitor 22 are not provided in the layout of the particular configuration example of the present embodiment are compared with each other.

It is to be noted that, in FIG. 4, a solid line A indicates a result of calculation of the crosstalk signal where the high-resistance Si substrate is used and a solid line B indicates a result of calculation of the crosstalk signal where the low-resistance Si substrate is used.

As depicted in FIG. 4, while the crosstalk current amount is suppressed within a frequency region of approximately 10 MHz or more by increasing the resistance of the substrate in comparison with the conventional structure, the degree of the suppression is approximately ⅒ and it is difficult to sufficiently suppress the crosstalk signal lower than the reception signal level (1 µA to 1 mA) assumed in the optical transmitter-receiver.

It is expected that the supporting substrate 3 is considered a parallel circuit of a resistance component determined by resistivity and a capacitive component determined by the permittivity. Although, by utilizing the high-resistance Si substrate, the resistance component increases and a propagating crosstalk component is suppressed, since this does not have an influence on a crosstalk component that passes the capacitive component of the substrate, the suppression rate as a whole is not very high.

Figure 5:
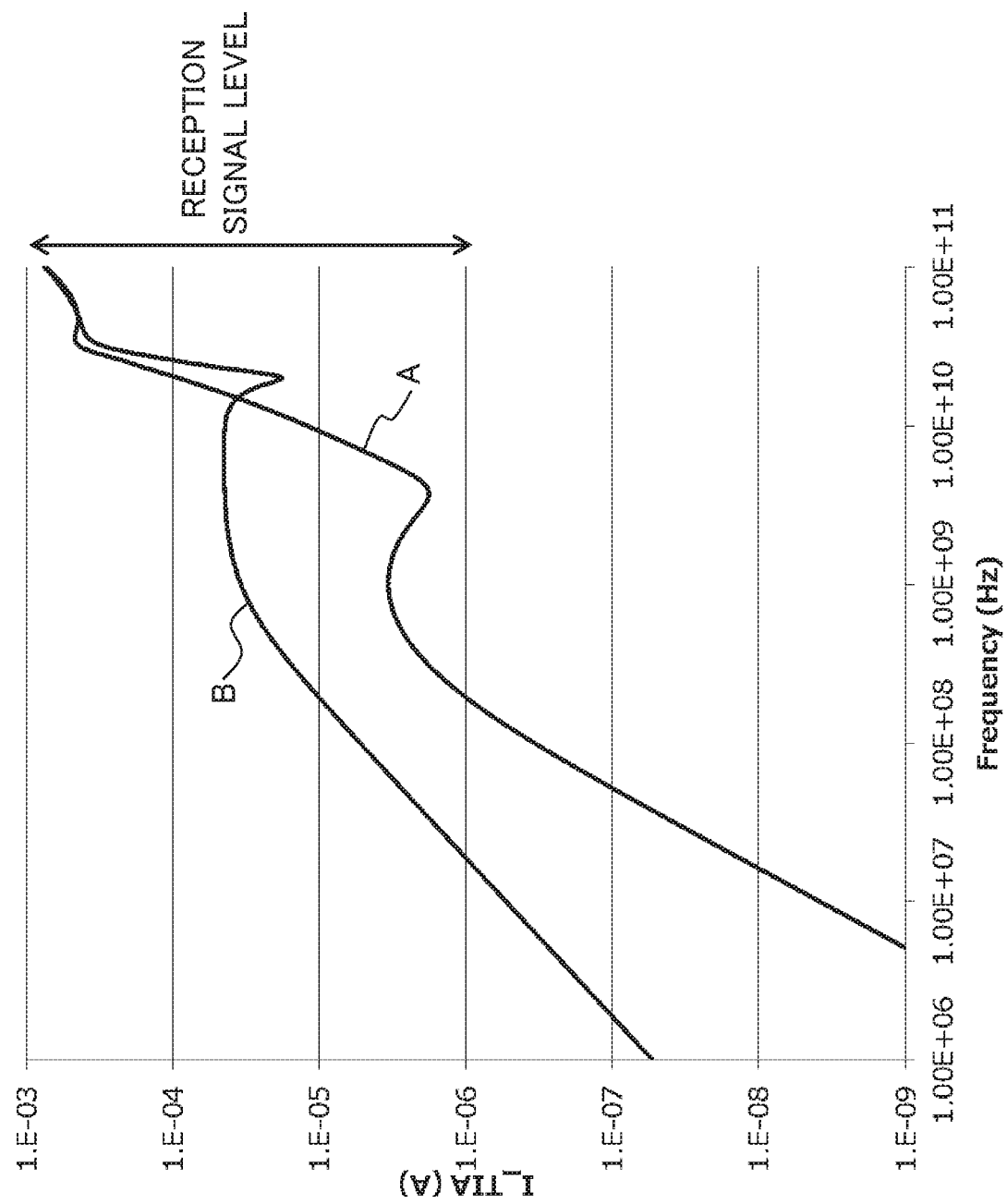
FIG. 5 is a view depicting a result of calculation by a simulation of the crosstalk signal at the TIA input terminal of the optical transmitter-receiver in a case in which a shield electrode is provided and in another case in which a shield electrode is not provided under the condition that a low-resistance Si substrate (resistivity of approximately 10 $\omega$cm) is provided but a bypass capacitor is not provided.

Then, FIG. 5 depicts a result when crosstalk signals (crosstalk current amounts) in a case in which the shield electrode 12 is provided and in another case in which the shield electrode 12 is not provided using a low-resistance Si substrate (resistivity of approximately 10 $\omega$cm) as the substrate 3 and without providing the bypass capacitor 22 are compared with each other in the layout of the particular configuration example of the present embodiment.

It is to be noted that, in FIG. 5, a solid line A indicates a result of calculation of the crosstalk signal where the shield electrode 12 is provided and a solid line B indicates a result of calculation of the crosstalk signal where the shield electrode 12 is not provided.

As depicted in FIG. 5, although the crosstalk current amount is suppressed by providing the shield electrode 12 in comparison with the conventional structure, it is difficult to sufficiently suppress the crosstalk signal lower than the reception signal level (1 µA to 1 mA) assumed in the optical transmitter-receiver.

Figure 6:
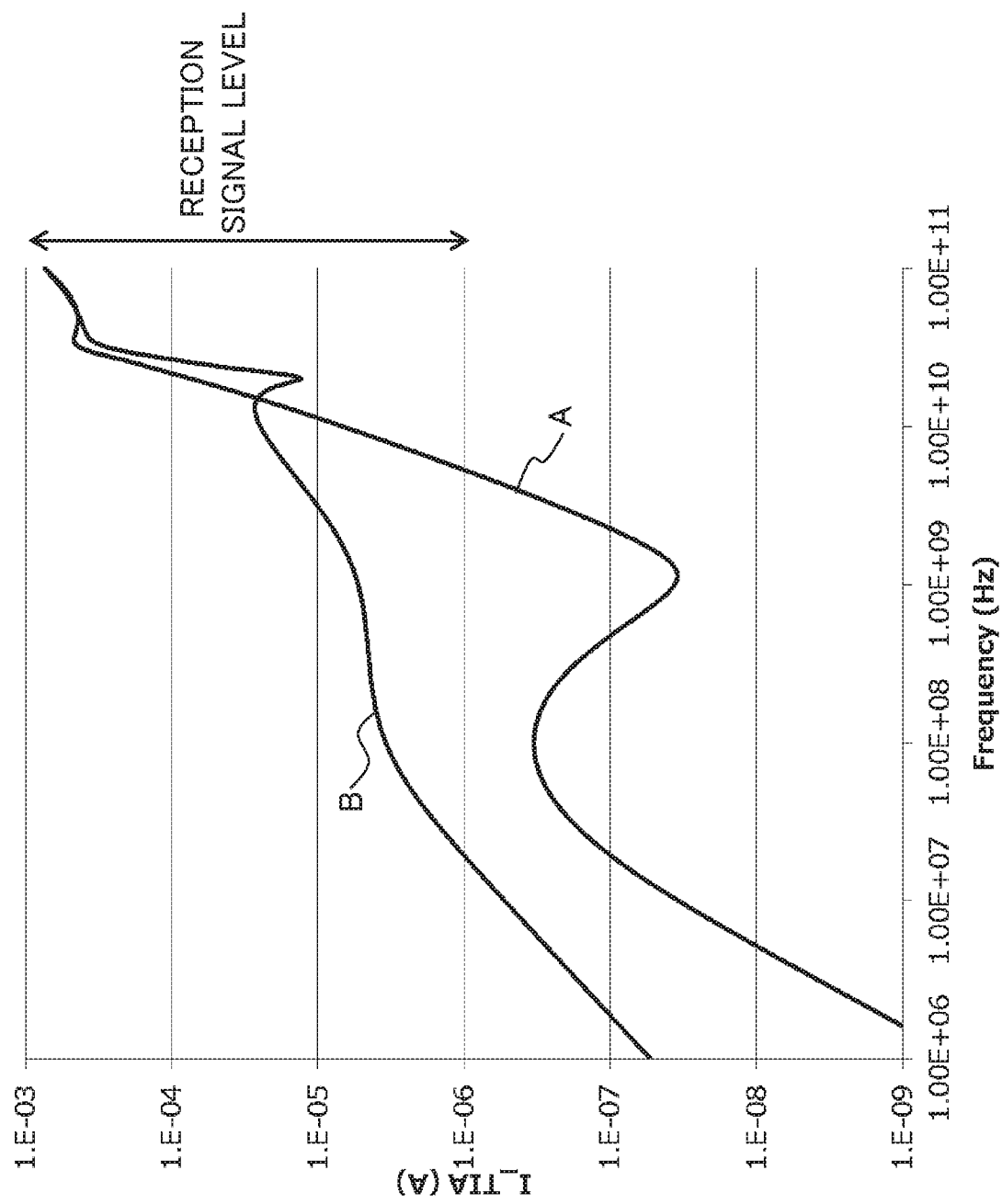
FIG. 6 is a view depicting a result of calculation by simulation of the crosstalk signal at the TIA input terminal of the optical transmitter-receiver in a case in which a shield electrode is provided and in another case in which a shield electrode is not provided under the condition that a high-resistance Si substrate (resistivity of approximately 100 $\omega$cm) is provided but a bypass capacitor is not provided.

Then, FIG. 6 depicts a result when crosstalk signals (crosstalk current amounts) in a case in which the shield electrode 12 is provided and in another case in which the shield electrode is not provided are compared with each other using a high-resistance Si substrate (resistivity of approximately 100 $\omega$cm) as the substrate 3 but without providing the bypass capacitor 22 in the layout in the particular configuration example of the present embodiment.

It is to be noted that, in FIG. 6, a solid line A indicates a result of calculation of the crosstalk signal where the shield electrode 12 is provided and a solid line B indicates a result of calculation of the crosstalk signal where the shield electrode 12 is not provided.

In FIG. 6, as indicated by a solid line B, in comparison with the conventional structure (for example, refer to the solid line B in FIG. 5), while the crosstalk current amount is suppressed only if the substrate 3 is changed to a high-resistance Si substrate (resistivity of approximately 100 $\omega$cm), it is difficult to sufficiently suppress the crosstalk signal lower than the reception signal level (1 µA to 1 mA) assumed in the optical transmitter-receiver.

In contrast, as indicated by the solid line A in FIG. 6, by changing the substrate 3 of the conventional structure to a high-resistance Si substrate (resistivity of approximately 100 $\omega$cm) and besides providing the shield electrode 12 on the substrate 3, the crosstalk current amount can be sufficiently suppressed and the crosstalk signal can be suppressed sufficiently lower than the reception signal level (1 µA to 1 mA) assumed in the optical transmitter-receiver in the frequency region lower than approximately 10 GHz.

Figure 7:
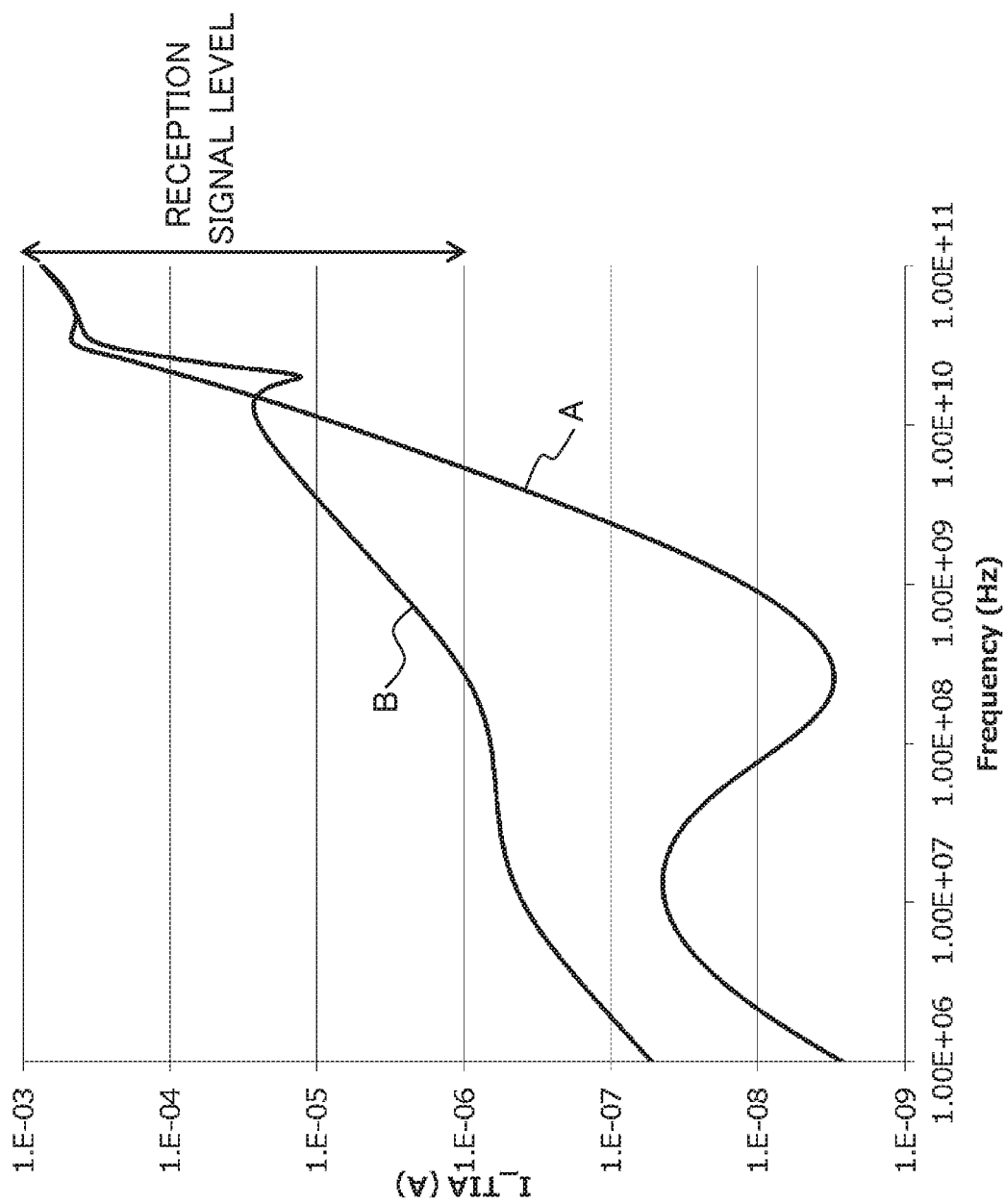
FIG. 7 is a view depicting a result of calculation by simulation of the crosstalk signal at the TIA input terminal of the optical transmitter-receiver in a case in which a shield electrode is provided and in another case in which a shield electrode is not provided under the condition that a high-resistance Si substrate (resistivity of approximately 750 $\omega$cm) is provided but a bypass capacitor is not provided.

Then, FIG. 7 depicts a result when crosstalk signals (crosstalk current amounts) in a case in which the shield electrode 12 is provided and in another case in which the shield electrode is not provided using the high-resistance Si substrate (resistivity of approximately 750 $\omega$cm) as the substrate 3 and without providing the bypass capacitor 22 in the layout in the particular configuration example of the present embodiment.

It is to be noted that, in FIG. 7, a solid line A indicates a result of calculation of the crosstalk signal in the case where the shield electrode 12 is provided and a solid line B indicates a result of calculation of the crosstalk signal in the case where the shield electrode 12 is not provided.

In FIG. 7, as indicated by the solid line B, in comparison with the configuration in which the substrate 3 of the conventional structure is changed to the high-resistance Si substrate (resistivity of approximately 750 $\omega$cm), the crosstalk current amount can be sufficiently suppressed by changing the substrate 3 of the conventional structure to the high-resistance Si substrate (resistivity of approximately 750 $\omega$cm) and besides providing the shield electrode 12 on the substrate 3 as indicated by the solid line A in FIG. 7, and the crosstalk signal can be suppressed sufficiently lower than the reception signal level (1 µA to 1 mA) assumed in the optical transmitter-receiver in a frequency region lower than approximately 10 GHz.

Figure 8:
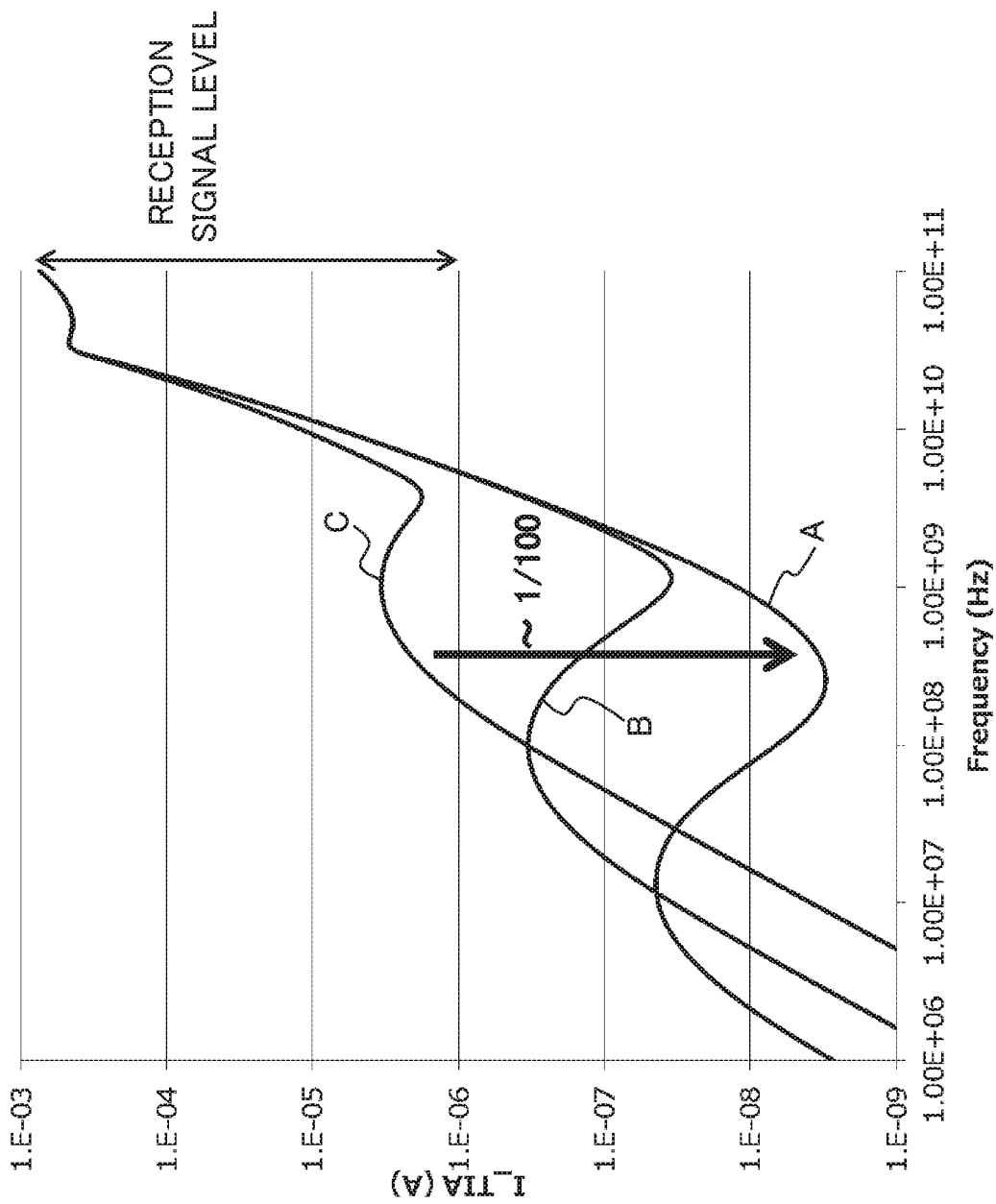
FIG. 8 is a view depicting a result of calculation by a simulation of the crosstalk signal at the TIA input terminal of the optical transmitter-receiver in a case in which a low-resistance Si substrate (resistivity of approximately 10 $\omega$cm) is used for the substrate, in another case in which a high-resistance Si substrate (resistivity of approximately 100 $\omega$cm) is used for the substrate and in a further case in which a high-resistance Si substrate (resistivity of approximately 750 $\omega$cm) is used for the substrate under the condition that a shield electrode is provided but a bypass capacitor is not provided.

Further, FIG. 8 depicts a result when crosstalk signals (crosstalk current amounts) in a case in which the substrate 3 is configured from a lower-resistance Si substrate (resistivity of approximately 10 $\omega$cm), another case in which the substrate 3 is configured from a high-resistance Si substrate (resistivity of approximately 100 $\omega$cm) and a further case in which the substrate 3 is configured from a high-resistance Si substrate (resistivity of approximately 750 $\omega$cm) are compared with each other with the shield electrode 12 provided but without providing the bypass capacitor 22 in the layout in the particular configuration example of the present embodiment.

It is to be noted that, in FIG. 8, a solid line A indicates a result of calculation of the crosstalk signal when the substrate 3 is configured from the high-resistance Si substrate (resistivity of approximately 750 ωcm), a solid line B indicates a result of calculation of the crosstalk signal when the substrate 3 is configured from the high-resistance Si substrate (resistivity of approximately 100 ωcm) and a solid line C indicates a result of calculation of the crosstalk signal when the substrate 3 is configured from the low-resistance Si substrate (resistivity of approximately 10 ωcm).

As depicted in FIG. 8, by providing the shield electrode 12 and increasing the resistance of the substrate 3, the crosstalk current amount can be sufficiently suppressed and the crosstalk signal can be suppressed sufficiently lower than the reception signal level (1 μA to 1 mA) assumed in the optical transmitter-receiver.

Further, from comparison with FIG. 4, it is recognized that the crosstalk signal is suppressed in a wide frequency region by adding the shield electrode 12.

Further, it is recognized that the suppression ratio between a case in which the substrate 3 is configured from a low-resistance Si substrate (resistivity of approximately 10 ωcm) and another case in which the substrate 3 is configured from a high-resistance Si substrate (resistivity of approximately 750 ωcm) reaches approximately 1/100 and becomes higher by approximately 10 times than that of the effect depicted in FIG. 4.

Further, it is recognized that, in the case where the substrate 3 is configured from the high-resistance Si substrate (resistivity of approximately 750 ωcm), the frequency at which the suppression effect of the crosstalk signal by insertion of the shield electrode 12 appears most remarkably shifts to a frequency region (approximately 200 MHz) further lower than that (approximately 2 GHz) in the case where the substrate 3 is configured from the low-resistance Si substrate (resistivity of approximately 10 ωcm) and suppression of the crosstalk signal is implemented over a wider frequency region.

This does not signify that a new effect is developed not by adding an individual effect by the shield electrode 12 and another individual effect by configuring the substrate 3 from the high-resistance substrate but by combining that the shield electrode 12 is provided and that the substrate 3 is configured using the high-resistance substrate.

The reason why, if the substrate 3 is configured from a high-resistance substrate in the case where the shield electrode 12 exists, a more remarkable effect is obtained is that the RC frequency that depends upon the coupling capacitance from the substrate 3 to the shield electrode 12 and the resistance component of the substrate 3 decreases by the increase of the resistance of the substrate 3 and it becomes possible for crosstalk components in a further lower region to bypass to the ground wiring line (in-chip GND) 5 of the electronic circuit chip 7 through the shield electrode 12.

It is to be noted that, while, in the particular configuration example of the present embodiment described above, a case in which the high-resistance substrate having the resistivity of approximately 750 ωcm is used is taken as an example, in order to reduce the crosstalk signal (crosstalk components) with respect to 1 μA that is the lowest reception signal level of a general optical transmitter-receiver, it is sufficient that the resistivity of the substrate 3 is set to 100 ωcm or more as indicated by a result of calculation of the crosstalk signal in FIG. 8.

Further, while, in FIGS. 4 to 8, a case in which there is no bypass capacitor 22 connected to the bias terminal (bias electrode) 20 of the optical detector 2 is taken as an example, by providing the bypass capacitor 22, the crosstalk component of the high frequency region of approximately 1 GHz or more can be suppressed still more as depicted in FIG. 3, and the crosstalk component can be reduced lower than the reception signal level (1 μA to 1 mA) assumed in the optical transmitter-receiver over a very wide frequency region from approximately 10 MHz to approximately 100 GHz.

Incidentally, the reason why such a configuration as described above is applied is such as described below.

Figure 12:
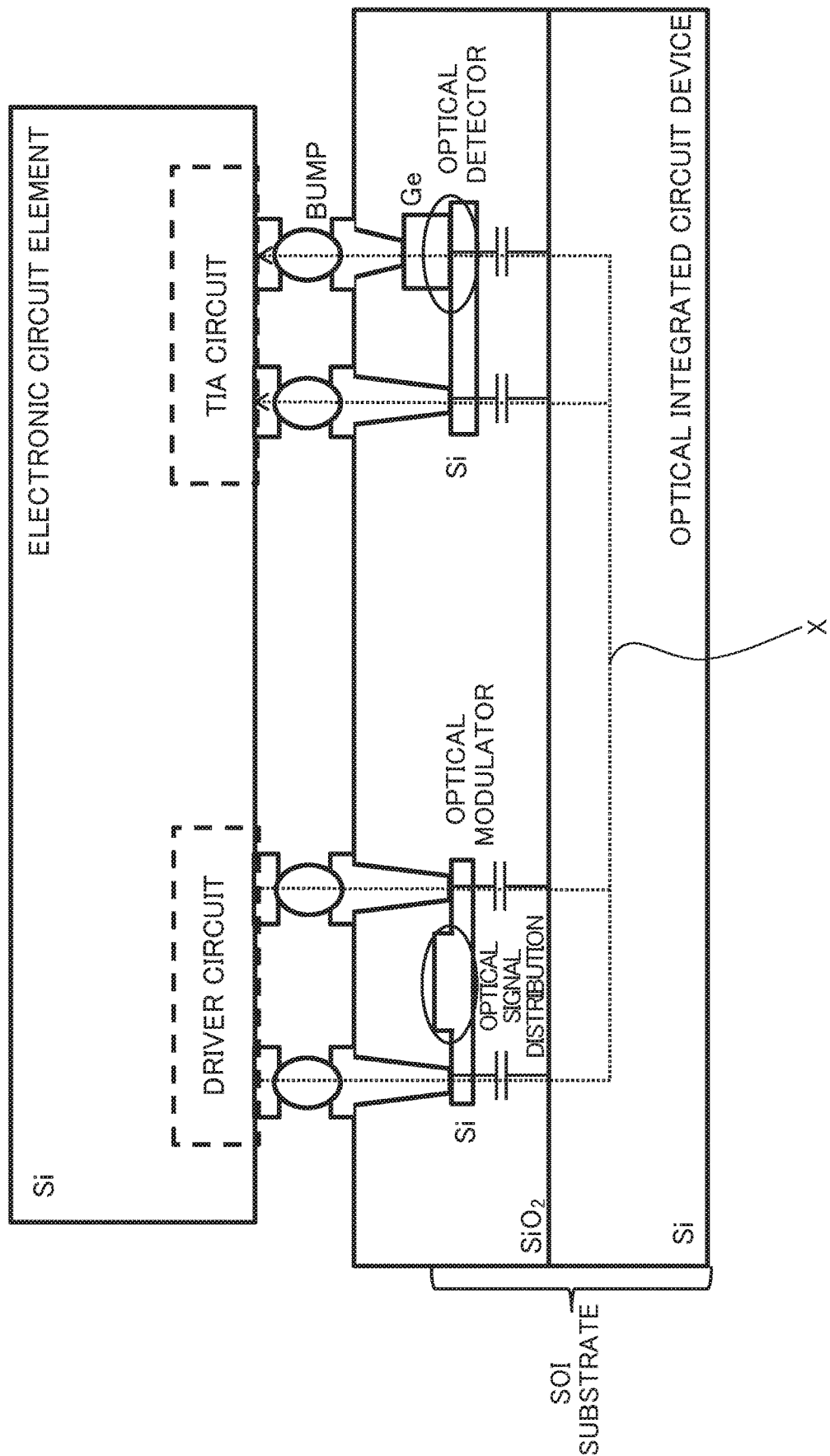
FIG. 12 is a view illustrating a subject of the present disclosure.

For example, as depicted in FIG. 12, a plurality of optical modulators that generate optical signals modulated with an electric data signal to be transmitted and optical detectors that decode received optical signals into electric data signals are integrated on an optical integrated circuit device formed on a silicon substrate or an SOI (Silicon on Insulator) substrate.

Such an optical integrated circuit device as just described can be fabricated with high accuracy and at a low cost utilizing a general process technology and apparatus for fabricating an electronic circuit element.

Further, in order to drive the optical modulators and the optical detectors formed in the optical integrated circuit device, electronic circuits such as a driver circuit and a trans impedance amplifier (TIA) circuit are required, and such circuits are prepared, for example, as electronic circuit elements formed on a silicon substrate of a separate body.

For example, as depicted in FIG. 12, such an optical integrated circuit device and an electronic circuit element as described above are mounted closely utilizing flip chip mounting and implement a function as an optical transmitter-receiver.

It is important to suppress, in such an optical transmitter-receiver as described above, crosstalk of transmission data handled in the driver circuit and the optical modulator and reception data handled in the TIA circuit and the optical detector and implement a good reception characteristic in the optical receiver.

However, it has been found that, in such an optical transmitter-receiver as depicted in FIG. 12, since the optical modulator and the optical detector are formed on a same silicon substrate, crosstalk through the substrate of the optical integrated circuit device occurs and deteriorates the reception characteristic.

In particular, as indicated by a dotted line X in FIG. 12, when the optical modulator is driven by a transmission electric data signal of a large amplitude generated by the driver circuit, a crosstalk signal is inputted to the substrate through the capacitance between the optical modulator and the silicon substrate.

This crosstalk signal propagates in the substrate and then is mixed into a reception electric data signal inputted from the optical detector to the TIA circuit through the capacitance between the optical detector and the silicon substrate.

Here, it has been found that, since the reception data signal generated in the optical detector generally has a small amplitude, the crosstalk signal component mixed through the substrate remarkably deteriorates the reception characteristic of the TIA circuit.

Therefore, such a configuration as described above is adopted in order to suppress crosstalk through the capacitance between the optical modulator and the substrate, the substrate, and the capacitance between the optical detector and the substrate to suppress deterioration of the reception characteristic.

Accordingly, the optical transmitter-receiver according to the present embodiment has an effect that crosstalk through the capacitance 16 between the optical modulator 1 and the substrate 3, the substrate 3, and the capacitance 17 between the optical detector 2 and the substrate 3 can be suppressed to suppress deterioration of the reception characteristic.

It is to be noted that, while the shield electrode 12 in the embodiment described above is provided on the surface of the optical integration device 4, this is not restrictive.

Figure 9:
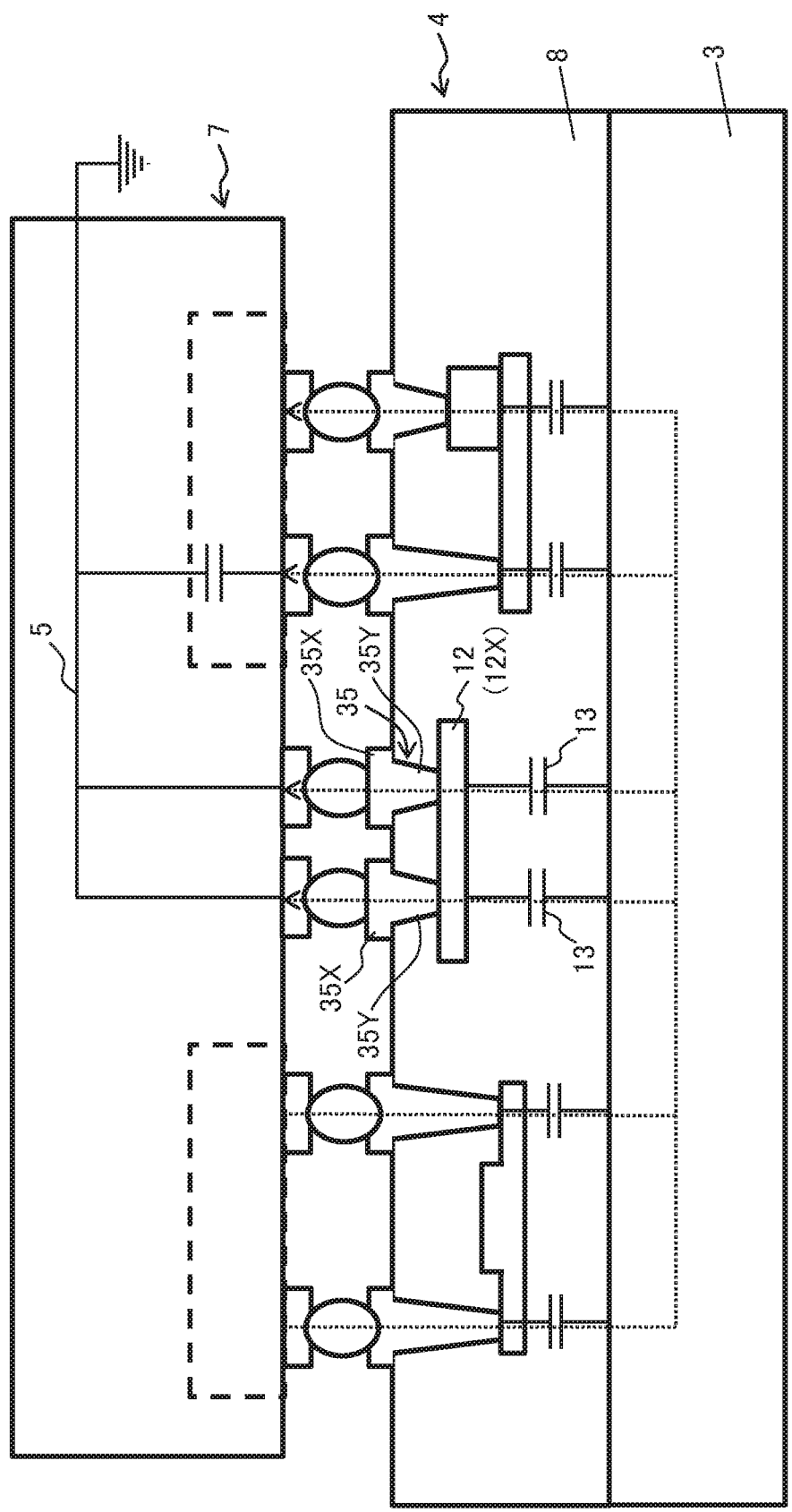
FIG. 9 is a sectional view depicting a configuration of an optical transmitter-receiver according to a modification of the present embodiment.
Figure 10:
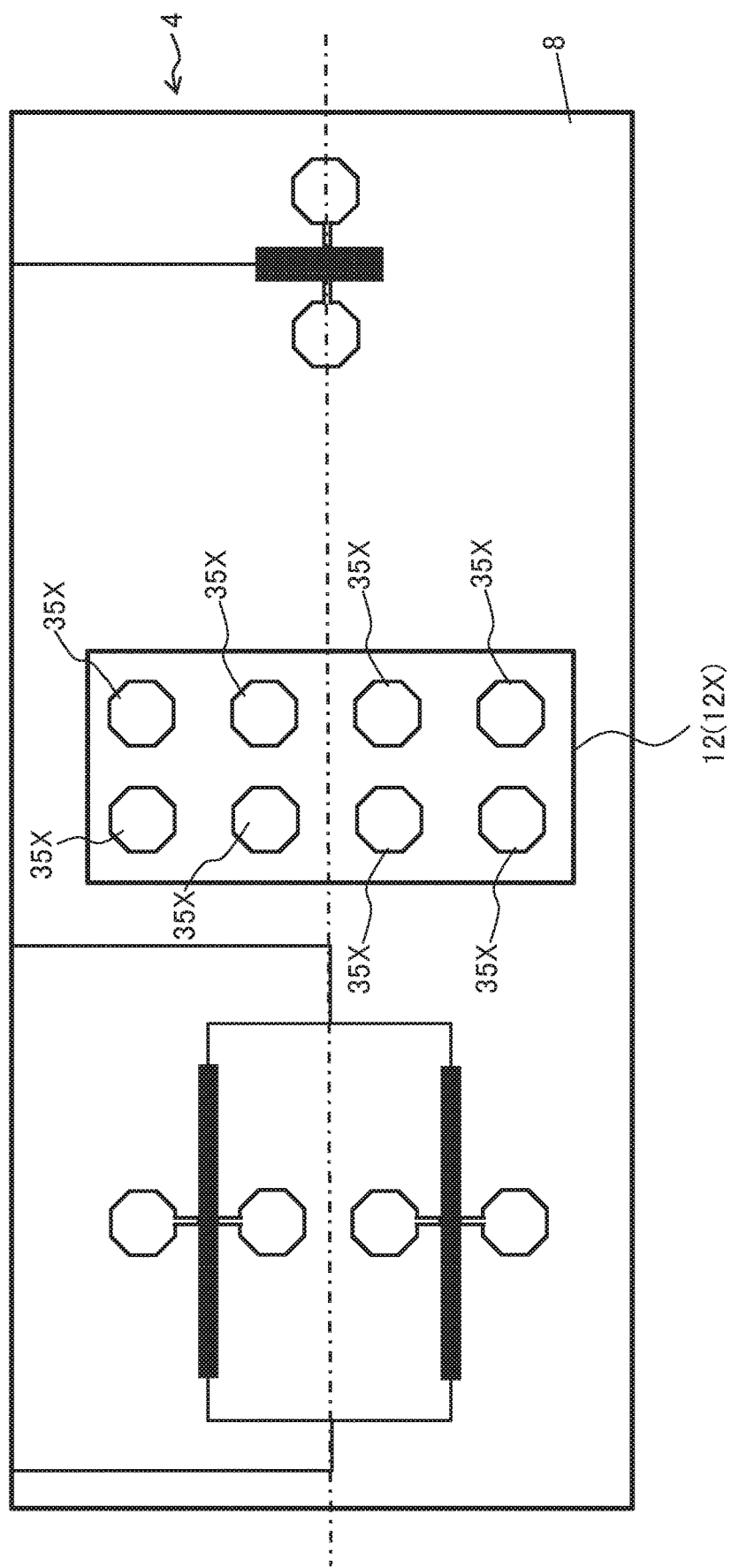
FIG. 10 is a top plan view depicting a configuration of the optical transmitter-receiver according to the modification to the present embodiment.

For example, the shield electrode 12 may be provided in the inside of the optical integration device 4 so as to be nearer the substrate 3 than the surface of the optical integration device 4 as depicted in FIGS. 9 and 10.

Further, the optical integration device 4 may include a shield wiring line 35 connected to the shield electrode 12 and extending to the surface of the optical integration device 4.

It is to be noted that the configuration of the other part may be a configuration similar to that of the embodiment described above. It is to be noted that, although reference characters required for the description are applied but the other reference characters are omitted in FIGS. 9 and 10 for the convenience of illustration, the omitted reference characters are similar to those depicted in FIGS. 1 and 2 that depict the configuration of the embodiment described above.

For example, in the case where the optical integration device 4 includes a multi-layer wiring line layer (for example, Al wiring line layer; metal layer), the shield electrode 12 may be configured from an Al layer 12X that is provided in a plane and included in the lowermost Al wiring line layer and is not connected to any other Al wiring line included in the lowermost Al wiring line layer.

Further, it is sufficient if the shield electrode 12 configured from the Al layer 12X provided in a plane is connected to Al pads (metal pads) 35X provided discretely on the surface of the optical integration device 4 by W plugs (metal plugs) 35Y similarly to the Al pads configuring the discrete shield electrodes 12 of the embodiment described above. In this case, the shield wiring lines 35 are configured from the Al pads 35X and the W plugs 35Y.

In this case, it is sufficient if, for example, as depicted in FIG. 10, the shield electrode 12 is configured as a planar Al layer 12X provided in a wide region so as to overlap with a plurality of Al pads 35X provided on the surface.

This makes it possible to increase the capacitance 13 between the shield electrode 12 and the substrate (supporting substrate) 3 to achieve a significant great crosstalk suppression effect over a lower frequency region.

Figure 11:
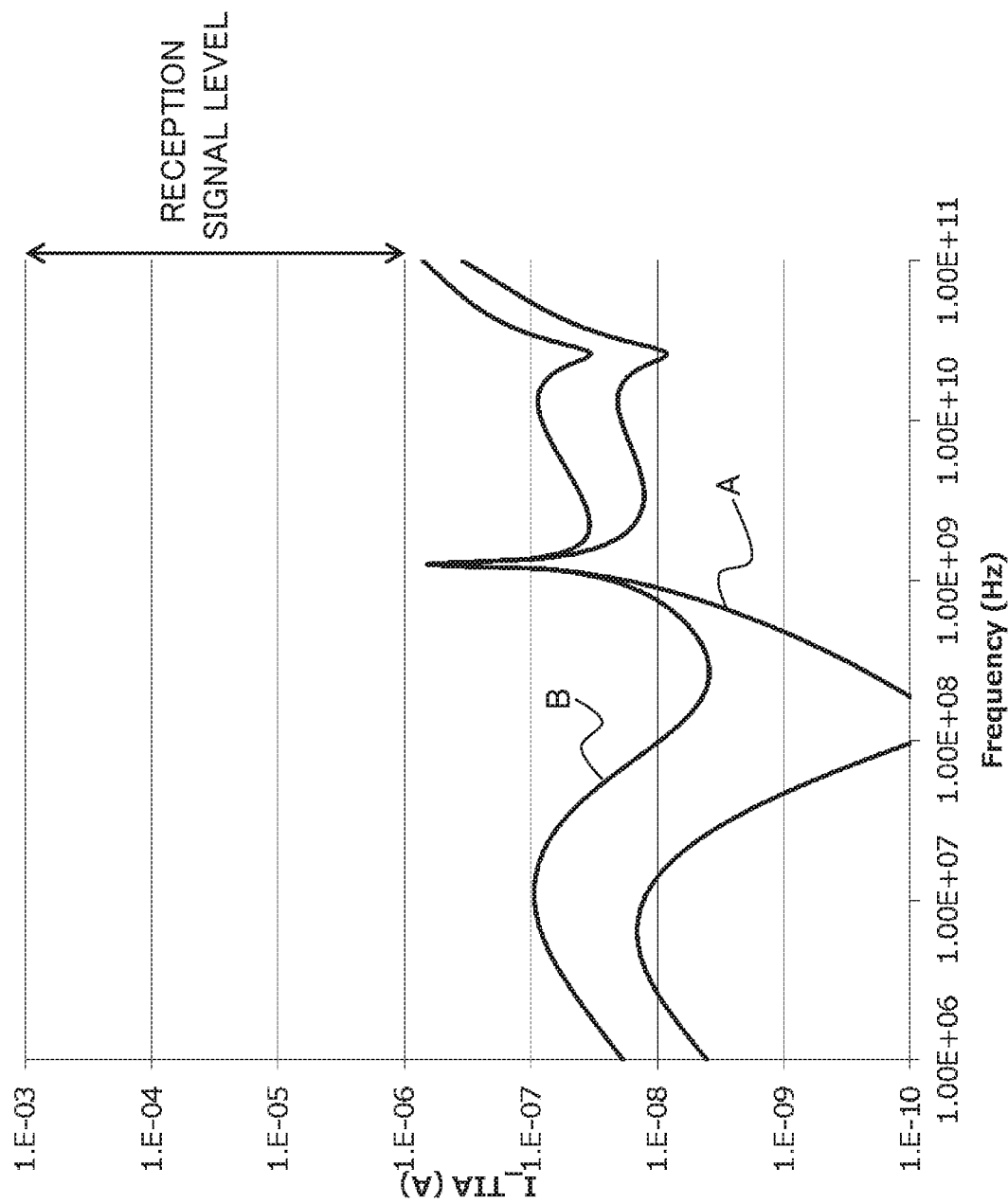
FIG. 11 is a view depicting a result of calculation by a simulation of the crosstalk signal at the TIA input terminal of the optical transmitter-receiver according to the modification of the present embodiment.

Here, FIG. 11 depicts a result of calculation of the crosstalk signal (crosstalk current amount) at the TIA input terminal (signal terminal) when the structure of this modification is simulated.

It is to be noted that, in FIG. 11, a solid line A indicates a result of calculation of the crosstalk signal in the structure of the present modification and a solid line B indicates a result of calculation of the crosstalk signal in the structure of the embodiment described above (particular configuration example).

Since the capacitance (coupling capacitance) 13 for coupling the shield electrode 12 and the supporting substrate 3 is great in comparison with a case of the structure of the embodiment described above as depicted in FIG. 11, the CR frequency with respect to the substrate resistance decreases and the crosstalk suppression effect in the low-frequency region of approximately 1 GHz or less can be enhanced more.

It is to be noted that, while the shield electrode 12 in the present modification is provided in a plane, the shield electrode 12 may otherwise be provided discretely similarly as in the case of the embodiment described above. Further, the shield electrode 12 may have some other shape.

It is to be noted that the technology disclosed herein is not limited to the configuration described in connection with the embodiment and the modification described above but can be modified in various manners without departing the subject matter of the present technology.

For example, while, in the embodiment and the modification described above, the optical integrated device 4 and the electronic circuit chip 7 are bump-joined by flip chip mounting, this is not restrictive. For example, the optical integrated device 4 and the electronic circuit chip 7 may be connected to each other, for example, by wire bonding.

As one aspect, the technology disclosure herein has an advantageous effect that crosstalk through the capacitance between the optical modulator and the substrate, the substrate, and the capacitance between the optical detector and the substrate can be suppressed to suppress deterioration of the reception characteristic.

All examples and conditional language recited herein are intended for the pedagogical purposes of aiding the reader in understanding the invention and the concepts contributed by the inventor to further the art, and are not to be construed limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. An optical transmitter-receiver, comprising:
    an optical integrated device in which at least an optical modulator and an optical detector are integrated as optical devices over the same substrate and an insulating layer is provided between the optical modulator and the substrate and between the optical detector and the substrate; and
    an electronic circuit chip that is connected to the optical integrated device and includes an electronic circuit including a ground wiring line; and wherein
    the optical integrated device includes a shield electrode between the optical modulator and the optical detector; and
    the shield electrode is provided sandwiching the insulating layer with the substrate to configure a capacitance and is connected to the ground wiring line of the electronic circuit chip.

2. The optical transmitter-receiver according to claim 1, wherein the substrate is a substrate having a resistivity of 100 ωcm or more.

3. The optical transmitter-receiver according to claim 1, wherein the substrate is a silicon substrate; and
    the insulating layer is an $SiO_2$ layer.

4. The optical transmitter-receiver according to claim 1, wherein the optical detector includes a signal terminal and a bias terminal and is provided such that the signal terminal is positioned at the side far from the optical modulator; and
    the electronic circuit chip includes a chip side bias terminal connected to the bias terminal of the optical detector and a capacitive element provided between the chip side bias terminal and the ground wiring line.

5. The optical transmitter-receiver according to claim 1, wherein the electronic circuit chip is flip chip mounted on the optical integrated device; and the shield electrode is connected to the ground wiring line of the electronic circuit chip through a bump.

6. The optical transmitter-receiver according to claim 1, wherein the shield electrode is an electrode that is not connected to the optical device provided in the optical integrated device.

7. The optical transmitter-receiver according to claim 1, wherein the shield electrode is provided on the surface of the optical integrated device.

8. The optical transmitter-receiver according to claim 1, wherein the shield electrode is provided in the inside of the optical integrated device so as to be near to the substrate rather than the surface of the optical integrated device; and
the optical integrated device includes a shield wiring line that is connected to the shield electrode and extends to the surface of the optical integrated device.

9. The optical transmitter-receiver according to claim 1, wherein the shield electrode is provided in plane.

10. The optical transmitter-receiver according to claim 1, wherein the shield electrode is provided discretely.

11. The optical transmitter-receiver according to claim 1, wherein the optical modulator is an optical modulator driven by a differential signal and includes a first signal terminal and a second signal terminal to which the differential signal is inputted;
the optical detector includes a signal terminal and a bias terminal;
the first signal terminal and the second signal terminal of the optical modulator are provided so as to be symmetric with respect to a line passing the center of the signal terminal of the optical detector; and
the shield electrode is provided so as to be symmetric with respect to a line passing the center of the signal terminal of the optical detector.

12. The optical transmitter-receiver according to claim 11, wherein the optical detector is provided such that the signal terminal is positioned at the side far from the optical modulator; and
the electronic circuit chip includes a chip side bias terminal connected to the bias terminal of the optical detector and a capacitive element provided between the chip side bias terminal and the ground wiring line.

* * * * *